US012176887B2

(12) United States Patent
Bernardon et al.

(10) Patent No.: US 12,176,887 B2
(45) Date of Patent: Dec. 24, 2024

(54) TRANSFORMER-BASED DRIVE FOR GaN DEVICES

(71) Applicant: Infineon Technologies Austria AG, Villach (AT)

(72) Inventors: Derek Bernardon, Villach (AT); Thomas Ferianz, Bodensdorf (AT); Kenneth Kin Leong, Villach (AT)

(73) Assignee: Infineon Technologies Austria AG, Villach (AT)

( * ) Notice: Subject to any disclaimer, the term of this patent is extended or adjusted under 35 U.S.C. 154(b) by 242 days.

(21) Appl. No.: 17/967,431

(22) Filed: Oct. 17, 2022

(65) Prior Publication Data
US 2024/0128967 A1 Apr. 18, 2024

(51) Int. Cl.
*H03K 17/16* (2006.01)
*H02M 1/08* (2006.01)
(Continued)

(52) U.S. Cl.
CPC ............ *H03K 17/162* (2013.01); *H02M 1/08* (2013.01); *H02M 7/06* (2013.01); *H01L 29/2003* (2013.01); *H01L 29/7786* (2013.01)

(58) Field of Classification Search
CPC .. H01L 29/2003; H01L 29/7786; H02M 1/08; H02M 7/06; H03K 17/161; H03K 17/162
(Continued)

(56) References Cited

U.S. PATENT DOCUMENTS

| 4,801,822 A | 1/1989 | Idaka et al. |
| 5,514,996 A | 5/1996 | Aizawa |

(Continued)

FOREIGN PATENT DOCUMENTS

| EP | 3745466 A1 | 12/2020 |
| EP | 3790194 A1 | 3/2021 |

OTHER PUBLICATIONS

Chen, Ren-Yi, et al., "Study and Implementation of a Current-Fed Full-Bridge Boost DC-DC Converter With Zero-Current Switching for High-Voltage Applications", IEEE Transactions on Industry Applications, vol. 44, No. 4, Jul./Aug. 2008, pp. 1218-1226.
(Continued)

*Primary Examiner* — William Hernandez
(74) *Attorney, Agent, or Firm* — Murphy, Bilak & Homiller, PLLC

(57) ABSTRACT

A power stage includes: a first transformer; a second transformer; a third transformer; a GaN (gallium nitride) enhancement mode power transistor configured to conduct a load current when driven by a gate current derived from energy transferred by the first transformer; a GaN depletion mode transistor configured to turn off the GaN enhancement mode power transistor absent a threshold voltage applied across a gate and a source of the GaN depletion mode transistor; a voltage clamping device or circuit configured to turn off the GaN depletion mode transistor when reverse biased by a bias current derived from energy transferred by the second transformer; and a GaN enhancement mode transistor configured to turn on the GaN depletion mode transistor when driven by a gate current derived from energy transferred by the third transformer.

20 Claims, 8 Drawing Sheets

(51) Int. Cl.
*H02M 7/06* (2006.01)
*H01L 29/20* (2006.01)
*H01L 29/778* (2006.01)

(58) Field of Classification Search
USPC .......................................... 327/108, 109, 110
See application file for complete search history.

(56) References Cited

U.S. PATENT DOCUMENTS

| | | | |
|---|---|---|---|
| 6,316,956 B1 | 11/2001 | Oglesbee | |
| 7,952,418 B2 | 5/2011 | McDonald et al. | |
| 8,760,219 B2 | 6/2014 | Chao | |
| 9,209,787 B2 | 12/2015 | Shelton et al. | |
| 9,305,917 B1 | 4/2016 | Curatola et al. | |
| 9,595,950 B1 | 3/2017 | Seok | |
| 9,853,637 B1 | 12/2017 | Meiser et al. | |
| 9,865,729 B1 | 1/2018 | Pendharkar et al. | |
| 10,483,352 B1 | 11/2019 | Mokhti et al. | |
| 10,720,913 B1 | 7/2020 | Leong et al. | |
| 10,958,268 B1 * | 3/2021 | Leong | H01L 24/49 |
| 10,979,032 B1 | 4/2021 | Leong et al. | |
| 11,329,646 B2 * | 5/2022 | Leong | H03K 17/687 |
| 2006/0238927 A1 | 10/2006 | Morbe et al. | |
| 2007/0081280 A1 | 4/2007 | Strzalkowski et al. | |
| 2009/0072269 A1 | 3/2009 | Suh et al. | |
| 2010/0060326 A1 | 3/2010 | Palmer et al. | |
| 2010/0118458 A1 | 5/2010 | Coffey | |
| 2010/0205614 A1 | 8/2010 | Harrington | |
| 2011/0273258 A1 | 11/2011 | Duplessis et al. | |
| 2012/0158188 A1 | 6/2012 | Madala | |
| 2014/0049297 A1 | 2/2014 | Nagai et al. | |
| 2014/0091311 A1 | 4/2014 | Jeon et al. | |
| 2014/0167724 A1 | 6/2014 | Deng et al. | |
| 2015/0171852 A1 | 6/2015 | Pang | |
| 2015/0228353 A1 | 8/2015 | Qing et al. | |
| 2015/0255547 A1 | 9/2015 | Yuan et al. | |
| 2015/0295574 A1 | 10/2015 | Nagai | |
| 2015/0318851 A1 | 11/2015 | Roberts et al. | |
| 2015/0344335 A1 | 12/2015 | Hughes et al. | |
| 2015/0381148 A1 | 12/2015 | Zeng | |
| 2016/0072376 A1 | 3/2016 | Ahlers et al. | |
| 2016/0087622 A1 | 3/2016 | Kaeriyama | |
| 2016/0142048 A1 | 5/2016 | Zoels et al. | |
| 2017/0040312 A1 | 2/2017 | Curatola et al. | |
| 2017/0271497 A1 | 9/2017 | Fayed et al. | |
| 2017/0331471 A1 | 11/2017 | Yuzurihara et al. | |
| 2019/0123215 A1 | 4/2019 | Stark | |
| 2019/0372567 A1 | 12/2019 | Yoshida et al. | |
| 2020/0007091 A1 | 1/2020 | Li et al. | |
| 2020/0007119 A1 | 1/2020 | Li et al. | |
| 2020/0020779 A1 | 1/2020 | Trang et al. | |
| 2020/0343352 A1 | 10/2020 | Trang et al. | |
| 2021/0067154 A1 | 3/2021 | Leong et al. | |
| 2021/0167772 A1 * | 6/2021 | Leong | H01L 24/08 |

OTHER PUBLICATIONS

Friedli, Thomas, et al., Design and Performance of a 200-KHz All—SiC JFET Current DC-Link Back-to-Back Converter, IEEE Transactions on Industry Applications, vol. 45, No. 5, Sep./Oct. 2009, pp. 1868-1878.

Kolar, J.W., et al., "Novel Three-Phase AC-DC-AC Sparse Matrix Converter", IEEE, 2002, pp. 777-787.

Lindemann, A., "A New IGBT with Reverse Blocking Capability", Entwurf fuer EPE Conference, European Conference on Power Electronics and Applications, Graz, Austria, 2001, pp. 1-7.

Nagai, Shuichi, et al., "A 3-phase AC-AC Matrix Converter GaN Chipset With Drive-by-Microwave Technology", Journal of the Electron Devices Society, vol. 2, Aug. 21, 2014, pp. 1-9.

Siemaszko, Daniel, et al., "Active Self-Switching Methods for Emerging Monolithic Bidirectional Switches Applied to Diode-Less Converters", 2009 13th European Conference on Power Electronics and Applications, Sep. 8-10, 2009, pp. 1-9.

Soeiro, Thiago B., et al., "Three-Phase Modular Multilevel Current Source Rectifiers For Electric Vehicle Battery Charging Systems", IEEE, 2013, pp. 623-629.

Coccia, A., et al., "Wide input Voltage range Compensation in DC/DC Resonant Architectures for On-Board Traction Power Supplies", IEEE 2007 European Conference on Power Electronics and Applications, Sep. 2-5, 2007, 1-10.

* cited by examiner

TRANSFORMER-BASED DRIVE FOR GaN DEVICES

BACKGROUND

Driving a GaN (gallium nitride) power transistor such as a GIT (Gate Injected Transistor) via a coreless transformer is typically implemented by using two coreless transformers to drive a single GaN power transistor. This approach consumes less power during the ON phase, as the power needed to deliver during the ON phase is: Vgs*Igate where Vgs is the gate-to-source voltage of the GaN power transistor and Igate is the gate current. However, power is consumed during the OFF phase because a resistor used to turn off the GaN power transistor must be biased. Furthermore, when there is significant parasitic inductance on the source of the GaN power transistor or significant dI/dt, a CMTI (common mode transient immunity) event is created which causes current to flow into the gate of the turn OFF device which in turn turns OFF the main GaN power transistor when the main GaN power transistor should instead be ON.

Another approach for driving a GaN power transistor via a coreless transformer includes a normally ON failsafe device that is inherently safer than the first approach. Even under cases when power might be lost on the transformer primary, the GaN power transistor is safely OFF. However, this approach requires more power during the ON phase. The total power delivered during the ON phase is: (Vgs+Vca)*Igate, where Vca is a Zener voltage which is needed to keep the normally ON failsafe device OFF when the GaN power transistor is ON. As compared to the first approach, the power requirement is significantly higher with the second approach during the ON phase. No power is consumed during the OFF phase, as the normally ON failsafe device keeps the GaN power transistor safely OFF. Unlike the first approach which consumes less power, the second approach is not susceptible to CMTI. CMTI can only cause more current to flow into the gate of the GaN power transistor when the GaN power transistor is ON. When the GaN power transistor is OFF, any generated CMTI current is absorbed by the normally ON failsafe device.

Hence, there is a need for a transformer-based drive approach for GaN power devices that is both low power and not susceptible to CMTI.

SUMMARY

According to an embodiment of a power stage, the power stage comprises: a first transformer; a second transformer; a third transformer; a GaN (gallium nitride) enhancement mode power transistor configured to conduct a load current when driven by a gate current derived from energy transferred by the first transformer; a GaN depletion mode transistor configured to turn off the GaN enhancement mode power transistor absent a threshold voltage applied across a gate and a source of the GaN depletion mode transistor; a voltage clamping device or circuit configured to turn off the GaN depletion mode transistor when reverse biased by a bias current derived from energy transferred by the second transformer; and a GaN enhancement mode transistor configured to turn on the GaN depletion mode transistor when driven by a gate current derived from energy transferred by the third transformer.

According to an embodiment of a GaN (gallium nitride) die, the GaN die comprises: a GaN enhancement mode power transistor configured to conduct a load current when driven by a gate current derived from energy transferred by a first transformer; a GaN depletion mode transistor configured to turn off the GaN enhancement mode power transistor absent a threshold voltage applied across a gate and a source of the GaN depletion mode transistor; a voltage clamping device or circuit configured to turn off the GaN depletion mode transistor when reverse biased by a bias current derived from energy transferred by a second transformer; and a GaN enhancement mode transistor configured to turn on the GaN depletion mode transistor when driven by a gate current derived from energy transferred by a third transformer.

According to another embodiment of a power stage, the power stage comprises: a first transformer; a GaN (gallium nitride) enhancement mode power transistor; a first rectification circuit having an input coupled across a secondary coil of the first transformer and an output configured to deliver current to a gate of the GaN enhancement mode power transistor; a second transformer having a primary coil with a center tap that is grounded or disconnected; a GaN enhancement mode transistor electrically connected between the gate and a source of the GaN enhancement mode power transistor; a resistor electrically connected between a gate and a source of the GaN enhancement mode transistor; and a second rectification circuit having an input coupled across a secondary coil of the second transformer and an output configured to deliver current to the gate of the GaN enhancement mode transistor, wherein a center tap of the secondary coil is coupled to the source of the GaN enhancement mode transistor.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide a low power, transformer-based drive approach for GaN power devices that offers low susceptibility to CMTI. To reduce CMTI susceptibility, a center-tapped coil may be introduced for the turn OFF device of the main GaN power device in a double transformer configuration. A triple transformer configuration is also disclosed, where power dissipation during the ON phase of the main GaN power device is minimized to a level sufficient to maintain a normally ON failsafe device in an OFF state when the main GaN power device is ON. The triple transformer configuration also has the advantage of requiring zero power during the OFF state of the main GaN power device.

Described next with reference to the figures are embodiments of the transformer-based drive approach for GaN power devices. The transformer-based drive features described herein may be used interchangeably unless otherwise expressly stated.

Figure 1:
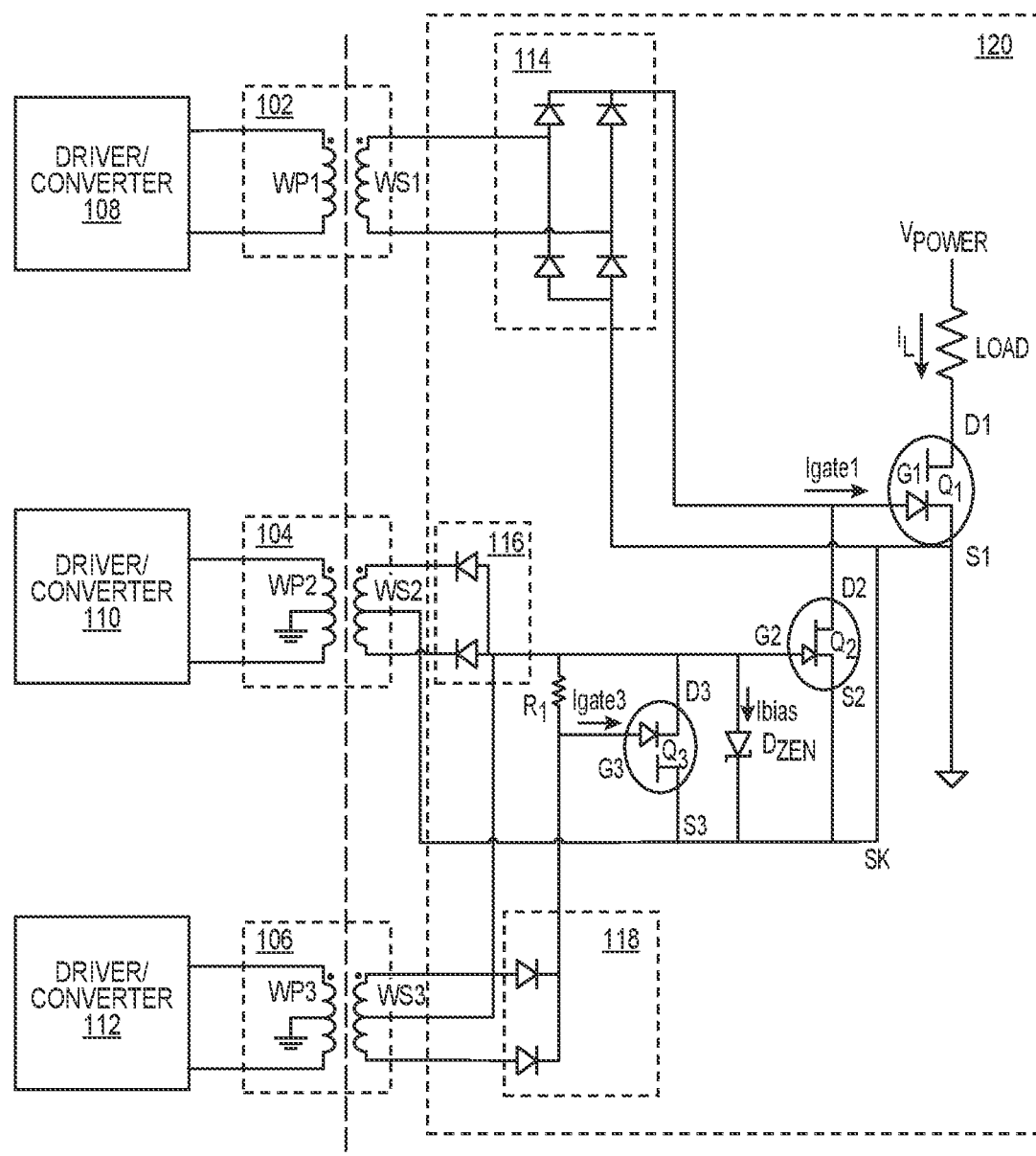
FIG. 1 illustrates a circuit schematic of an embodiment of a power stage that implements a transformer-based drive approach for a GaN power device.

FIG. 1 illustrates a circuit schematic of an embodiment of a power stage 100. The power stage 100 may form part of a power electronics circuit for use in various power applications such as such as server, datacom, telecom, adapter/charger, wireless charging, audio, lighting (e.g., LED drivers), etc., for delivering power ($V_{Power} \times I_L$) to a load which is illustrated as a resistor labeled 'LOAD' in FIG. 1.

The power stage 100 includes a first transformer 102, a second transformer 104, and a third transformer 106. The three transformers 102, 104, 106 provide galvanic isolation between a secondary side of the power stage 100 that includes a GaN (gallium nitride) enhancement mode (i.e., normally-off) power transistor Q1 and a primary side of the power stage 100 that includes a respective driver/power converter circuit 108, 110, 112 for each transformer 102, 104, 106. The galvanic isolation barrier is indicated by the vertical dashed line in FIG. 1.

The GaN enhancement mode power transistor Q1 conducts a load current $I_L$ when driven at its gate G1 by a gate current Igate1. The gate current Igate1 for the GaN enhancement mode power transistor Q1 is derived by a rectification circuit 114 from energy transferred by the first transformer 102.

A GaN depletion mode (i.e., normally-on) transistor Q2 on the secondary side of the power stage 100 turns off the GaN enhancement mode power transistor Q1 absent a threshold voltage applied across the gate G2 and source S2 of the GaN depletion mode transistor Q2. The drain D2 of the GaN depletion mode transistor Q2 is electrically connected to the gate G1 of the GaN enhancement mode power transistor Q1.

A voltage clamping device or circuit on the secondary side of the power stage 100 turns off the GaN depletion mode transistor Q2 when reverse biased by a bias current Ibias. The bias current Ibias is derived by a second rectification circuit 116 from energy transferred by the second transformer 104. The second rectification circuit 116 may be realized by GaN devices in a diode configuration.

In FIG. 1, the voltage clamping device or circuit is illustrated as a Zener diode $D_{ZEN}$ having an anode electrically connected to the gate G2 of the GaN depletion mode transistor Q2 and a cathode electrically connected to the source S2 of the GaN depletion mode transistor Q2. In the case of GaN technology, the Zener diode functionality may be implemented by a GaN subcircuit which performs the clamping function. For example, the Zener diode functionality may be implemented by a GaN-gated diode having an anode electrically connected to the gate G2 of the GaN depletion mode transistor Q2 and a cathode electrically connected to the source S2 of the GaN depletion mode transistor Q2. Still other types of voltage clamping devices or circuits may be used to turn off the GaN depletion mode transistor Q2 when reverse biased by the bias current Ibias derived from energy transferred by the second transformer 104.

A GaN enhancement mode transistor Q3 on the secondary side of the power stage 100 turns on the GaN depletion mode transistor Q2 when driven at its gate G3 by a gate current Igate3. The gate current Igate3 for the GaN enhancement mode transistor Q3 is derived by a third rectification circuit 118 and a resistor R1, from energy transferred by the third transformer 106.

The drain D3 of the GaN enhancement mode transistor Q3 is electrically connected to the gate G2 of the GaN depletion mode transistor Q2. The source S3 of the GaN enhancement mode transistor Q3 is electrically connected to the source S2 of the GaN depletion mode transistor Q2 and to the source S1 of the GaN enhancement mode power transistor Q1. The common source connection between the GaN transistors Q1, Q2, Q3 on the secondary side of the power stage 100 may form a source Kelvin 'SK' terminal, for example. In one embodiment, the GaN transistors Q1, Q2, Q3, the voltage clamping device or circuit, and the rectification circuits 114, 116, 118 are integrated in the same GaN die 120.

The primary winding WP2 of the second transformer 104 may have a center tap that is grounded, e.g., as shown in FIG. 1, or that is disconnected/left open. The primary winding WP2 of the second transformer 104 instead may be disconnected or left open/floating. The secondary winding WS2 of the second transformer 104 may have a center tap that is coupled to the source S2 of the GaN depletion mode transistor Q2 and to the source S3 of the GaN enhancement mode transistor Q3.

Separately or in combination, the primary winding WP3 of the third transformer 106 may have a center tap that is grounded, e.g., as shown in FIG. 1, or that is disconnected/left open. The primary winding WP3 of the third transformer 106 instead may be disconnected or left open/floating. The secondary winding WS3 of the third transformer 106 may have a center tap that is coupled to the gate G2 of the GaN depletion mode transistor Q2 and to the drain D3 of the GaN enhancement mode transistor Q3, or that is disconnected/left open.

The embodiment shown in FIG. 1 minimizes power dissipation and enhances CMTI robustness. In response to the third driver/converter circuit 112, the third transformer 106 delivers a two or more pulses to turn ON the GaN enhancement mode transistor Q3 which in turn turns ON the GaN depletion mode transistor Q2. The GaN depletion mode transistor Q2 is a normally-on device that turns OFF the GaN enhancement mode power transistor Q1 which is the main power device of the power stage 100.

Accordingly, no power transmission is required during the OFF phase of the GaN enhancement mode power transistor Q1. Also, power transmission is minimized during the ON phase of the GaN enhancement mode power transistor Q1 because the first transformer 102 delivers a minimum/only power of: Vgs*Igate. The second transformer 104 keeps the Zener diode $D_{ZEN}$ in reverse bias without any parallel resistor. Hence, in steady state, the second transformer 104 delivers a minimum power of Vca_Zener*Ica_Zener, where the current Ica_Zener is a bias current needed to keep the Zener voltage sufficiently high to maintain the GaN depletion mode transistor Q2 in the OFF state.

The embodiment shown in FIG. 1 reduces the size of the transformers 102, 104, 106 compared to conventional transformed-based drive approaches, by minimizing the power delivered in steady state. However, the turn ON time of the GaN enhancement mode power transistor Q1 is an important consideration. Depending on the application, the GaN depletion mode transistor Q2 may begin turning OFF before sending charge to the gate G1 of the GaN enhancement mode power transistor Q1. Since the second transformer 104 requires time to remove charge from the gate G2 of the GaN depletion mode transistor Q2 and to bring the GaN depletion mode transistor Q2 into the OFF state, the second transformer 104 is dimensioned based on the intended application. If the switching frequency of the GaN enhancement mode power transistor Q1 is relatively low, then the second transformer 104 can be made small. If, however, the switching frequency is relatively high, the second transformer 104 becomes larger.

Figure 2:
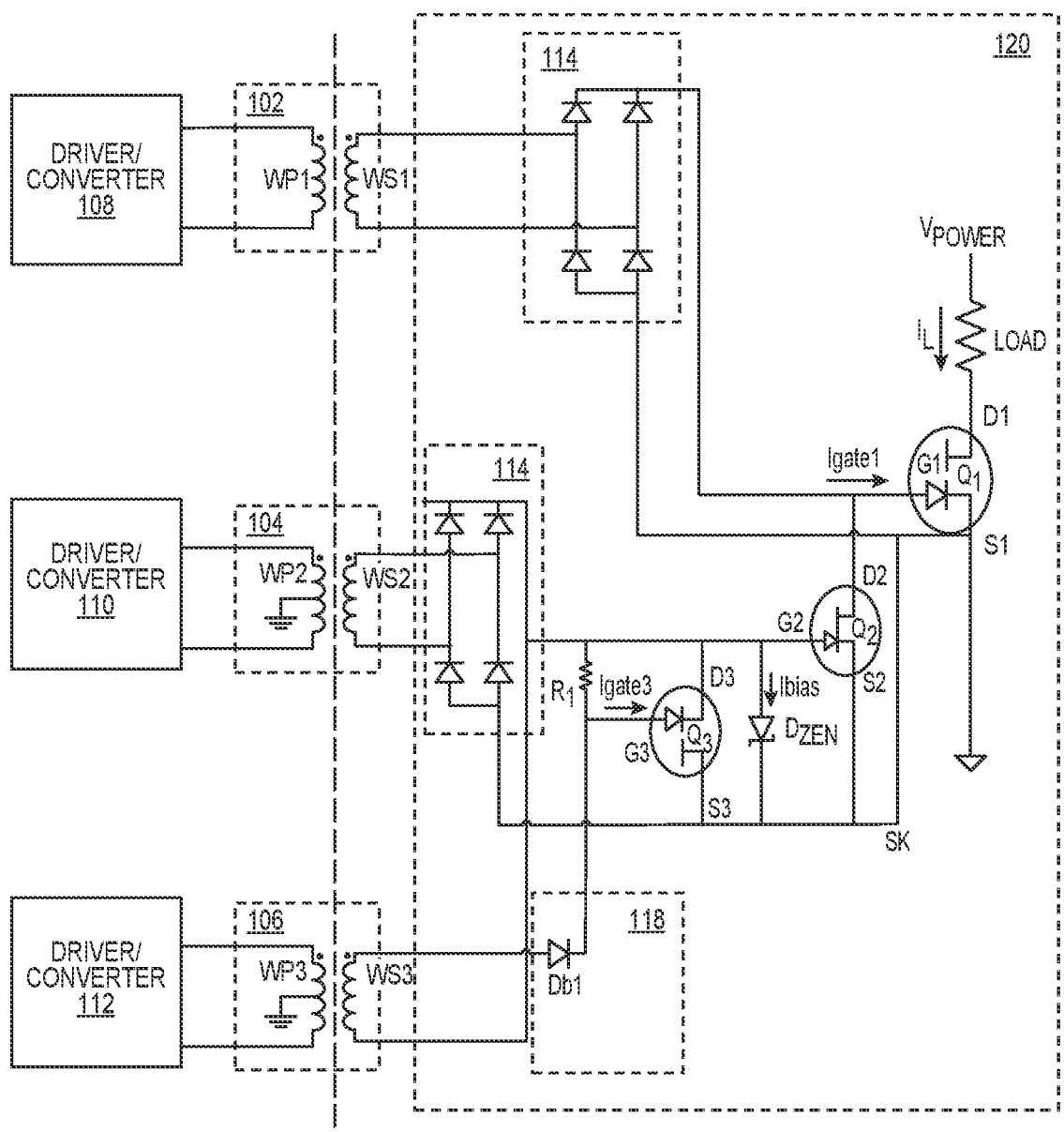
FIG. 2 illustrates a circuit schematic of another embodiment of a power stage that implements a transformer-based drive approach for a GaN power device.

FIG. 2 illustrates a circuit schematic of another embodiment of the power stage 100 having three transformers 102, 104, 104. In FIG. 2, both the primary winding WP2 and the secondary winding WS2 of the second transformer 104 include a single coil, and both the primary winding WP3 and the secondary winding WS3 of the third transformer 107 are each a single coil. Separately or in combination, both the primary winding WP1 and the secondary winding WS1 of the first transformer 104 may each be a single coil, e.g., as shown in FIGS. 1 and 2.

The second biasing circuit 116 in FIG. 2 has an input coupled across the single coil of the secondary winding WS2 of the second transformer 106 and an output that delivers the bias current Ibias to the voltage clamping device or circuit which is a Zener diode $D_{ZEN}$ in FIG. 2 but instead may be a GaN-gated diode, e.g., as previously described herein. The third biasing circuit 118 includes a single diode Db1 in FIG. 2 that has an anode coupled to a first end of the single coil of the secondary winding WS3 of the third transformer 106 and a cathode that delivers gate current Igate3 to the gate G3 of the GaN enhancement mode transistor Q3.

In FIG. 2, the power stage area is reduced even further by using single coils for the second and third transformers 104, 106 but while maintaining CMTI performance for the turning ON of the GaN enhancement mode transistor Q3. The center tapped configuration is removed from driving the GaN depletion mode transistor Q2 as the embodiment in FIG. 2 is already CMTI robust, because a CMTI event can only remove charge from the gate G2 of the GaN depletion mode transistor Q2, meaning the CMTI event can only turn OFF the GaN depletion mode transistor Q2.

If the GaN enhancement mode power transistor Q1 is the ON state, the GaN depletion mode transistor Q2 is already OFF. If the GaN enhancement mode power transistor Q1 is in the OFF state, then the GaN depletion mode transistor Q2 is ON and a large amount of charge is needed to turn OFF the GaN depletion mode transistor Q2, something that a single CMTI event cannot manage as long as the second transformer 104 is small enough. If the GaN depletion mode transistor Q2 is ON, a CMTI event at the first transformer 102 can only put charge into the gate G1 of the GaN enhancement mode power transistor Q1 but this charge is absorbed by the GaN depletion mode transistor Q2.

Only a few pulses are needed to turn the GaN enhancement mode transistor Q3 ON. Instead of using a center tapped configuration as shown in FIG. 1, a single coil WS3 with a single diode Db1 may be used to maintain the CMTI robustness as shown in FIG. 2, where the CMTI robustness is achieved by having series inductance and parasitic capacitance.

Figure 3:
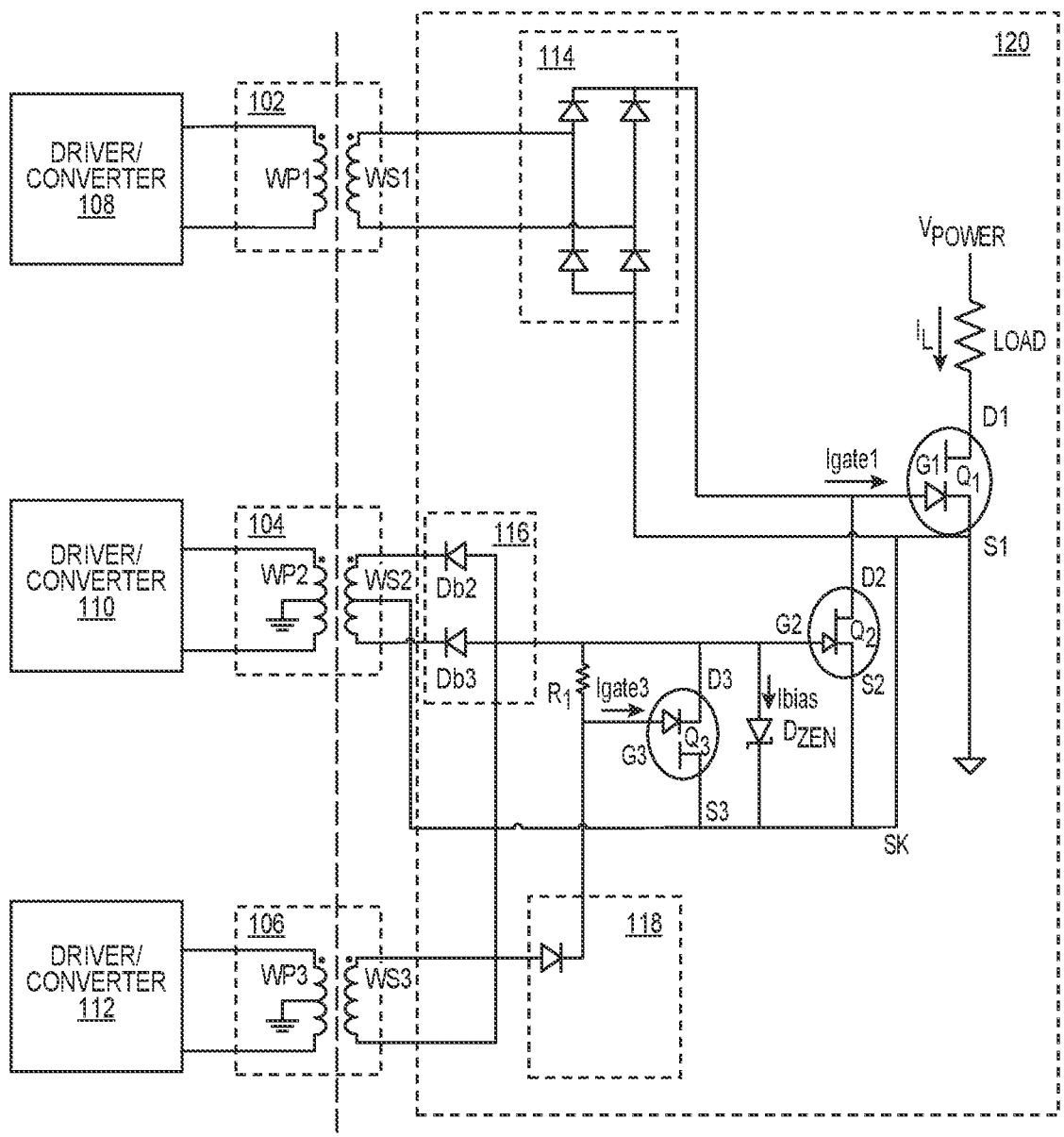
FIG. 3 illustrates a circuit schematic of another embodiment of a power stage that implements a transformer-based drive approach for a GaN power device.

FIG. 3 illustrates a circuit schematic of another embodiment of the power stage 100 having three transformers 102, 104, 106. In FIG. 3, the primary winding WP2 of the second transformer 104 has a center tap that is grounded but instead may be disconnected, and the secondary winding WS2 of the second transformer 104 has a center tap that is coupled to the source S2 of the GaN depletion mode transistor Q2 and to the source S3 of the GaN enhancement mode transistor Q3. Also in FIG. 3, the second biasing circuit 116 includes a first diode Db2 having a cathode coupled to a first end of the secondary winding WS2 of the second transformer 104 and an anode coupled to the opposite end of the single coil of the secondary winding WS3 of the third transformer 106 as the single biasing diode Db1. The second biasing circuit 116 also includes a second diode Db3 having a cathode coupled to the opposite end of the secondary winding WS2 of the second transformer 104 as the first diode Db2 and an anode electrically connected to the gate G2 of the GaN depletion mode transistor Q2 and to the anode of the voltage clamping device or circuit Zener diode $D_{ZEN}$ which instead may be a GaN-gated diode. The cathode of the voltage clamping device or circuit Zener diode $D_{ZEN}$ or GaN-gated diode is electrically connected to the source S2 of the GaN depletion mode transistor Q2.

For higher switching frequencies of the GaN enhancement mode power transistor Q1, the larger the size of the second transformer 104 that controls the GaN depletion mode transistor Q2. However, the power stage 100 becomes more susceptible to CMTI with increasing size of the second transformer 104. The embodiment illustrated in FIG. 3 addresses this limitation by using a center-tapped coil for the GaN depletion mode transistor Q2, which improves charge throughput.

As explained above, GaN transistors Q1 and Q3 are enhancement mode devices and GaN transistor Q2 is a depletion mode device. That is, GaN transistors Q1 and Q3 are normally off at zero gate—source voltage and GaN transistor Q2 is normally on at zero gate—source voltage.

Figure 4:
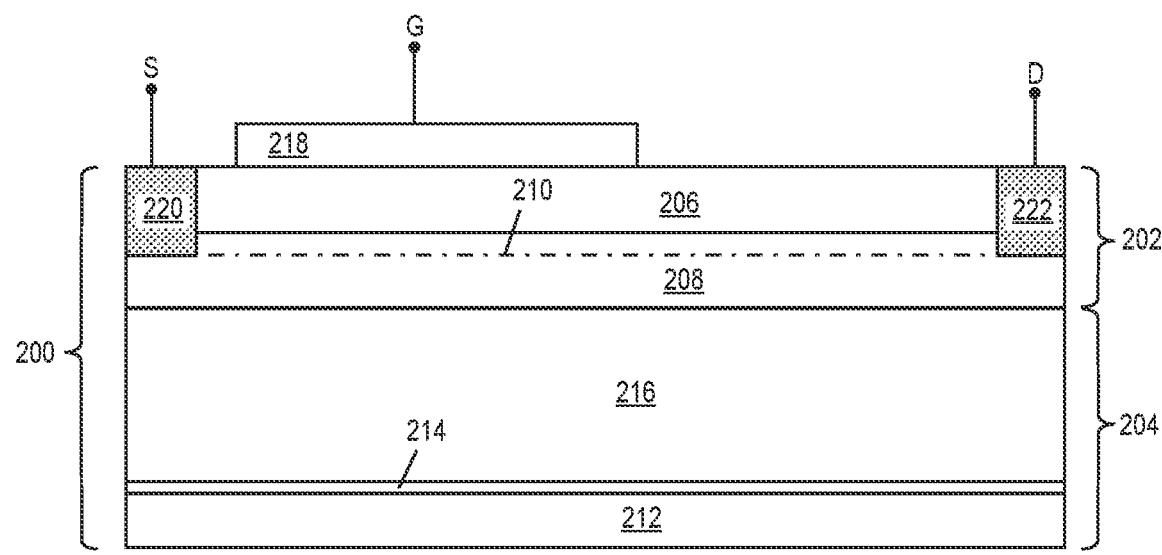
FIG. 4 illustrates a cross-sectional view of an embodiment of a depletion mode GaN device for use in any of the power stages shown in FIGS. 1 through 3.
Figure 5:
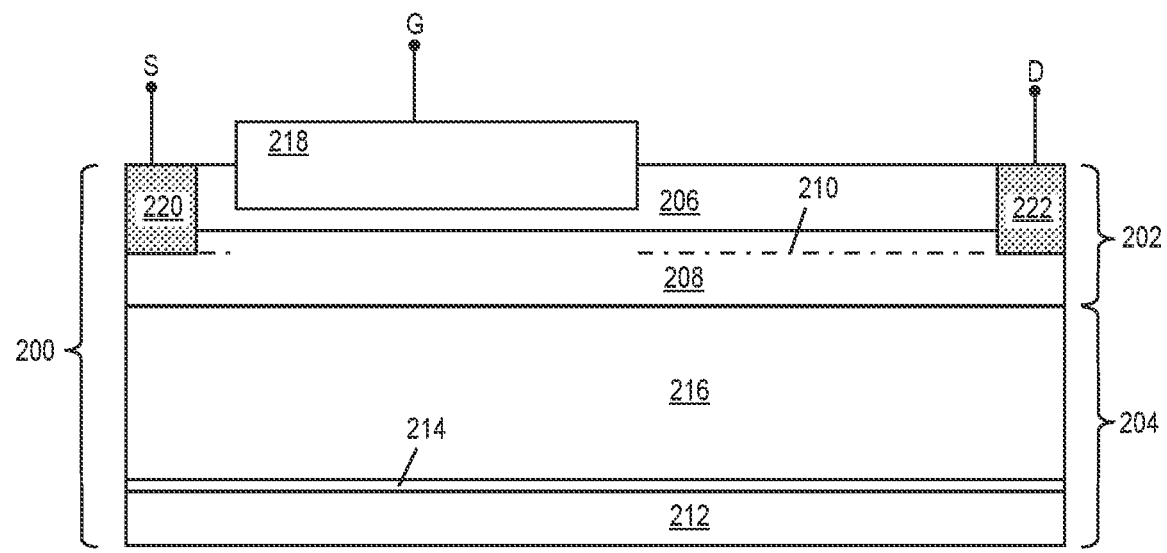
FIG. 5 illustrates a cross-sectional view of an embodiment of an enhancement mode GaN device for use in any of the power stages shown in FIGS. 1 through 3.

FIG. 4 illustrates a cross-sectional view of an embodiment of a depletion mode GaN device, and FIG. 5 illustrates a cross-sectional view of an embodiment of an enhancement mode GaN device. The transistor structure shown in FIG. 4 may be used for GaN transistor Q2, and the transistor structure shown in FIG. 5 may be used for GaN transistors Q1 and Q3.

In FIG. 4, semiconductor body 200 has an upper active region 202 and a lower region 204 that is disposed beneath the active region 202. The active region 202 refers to the layers or regions of the semiconductor body 200 that provide an electrically conductive channel. For example, in the depicted embodiment, the active region 202 includes first and second type III-V semiconductor layers 206, 208. The second type III-V semiconductor layer 208 is formed from a semiconductor material having a different band gap than the first type III-V semiconductor layer 206. For example, the first type III-V semiconductor layer 206 may include intrinsic or lightly doped gallium nitride (GaN) and the second type III-V semiconductor layer 208 may include aluminum gallium nitride (AlGaN). More generally, any combination of type III-V semiconductor materials with different metallic contents can be used to provide a difference in bandgap. Due to the difference in bandgap between the first and second type III-V semiconductor layers 206, 208, an electrically conductive two-dimensional charge carrier gas channel 210 arises near an interface between the first type III-V semiconductor layer 206 and the second type III-V semiconductor layer 208 due to polarization effects. Alternatively, instead of type III-V semiconductor material, the active region 202 may include group IV semiconductor materials such as Silicon (Si), Silicon carbide (SiC), Silicon germanium (SiGe), etc. The semiconductor materials may be doped to form active device regions, e.g., source, drain, collector, emitter, etc., which provide a controllable electrically conductive channel in a known manner.

The lower portion 204 of the semiconductor body 200 includes various regions of the semiconductor body 200 that do not directly contribute in an electrical sense to the provision of the electrically conductive channel 210. In the depicted embodiment, the lower portion 204 of the semiconductor body 200 includes a substrate region 212, a nucleation layer 214, and a lattice transition region 216. The substrate region 212 may include or be formed from group IV or group III-V semiconductor materials. For example, according to one embodiment, the substrate region 212 may be provided by a silicon or silicon-based wafer. The nucleation layer 214, which may include a metal nitride (e.g., AlN), and the lattice transition region 216, which may include a number of semiconductor nitride (e.g., AlGaN) layers with a gradually diminishing metallic content, are provided on the substrate region 212 to enable the formation of relatively strain and defect free group IV semiconductor material thereon. More generally, the substrate region 212 may include any intrinsic or bulk portion of the substrate that is beneath the active region 202, and is more conductive than an intermediary region that is between the substrate region 212 and the active region 202.

A gate structure 218 controls the electrically conductive channel 210 between source and drain terminals 220, 222. The GaN transistor structure in FIG. 4 is normally on at zero gate—source voltage and may be used for GaN depletion mode transistor Q2. Accordingly, the electrically conductive channel 210 is uninterrupted below the gate structure 218 and the source and drain terminals 220, 222 are electrically connected absent a gate—source voltage.

In FIG. 5, the gate structure 218 is partly recessed into the first type III-V semiconductor layer 206 to disrupt the electrically conductive channel 210 at zero gate—source voltage. Accordingly, the GaN transistor structure in FIG. 5 is a normally off device and may be used for GaN enhancement mode transistors Q1 and Q3.

Figure 6:
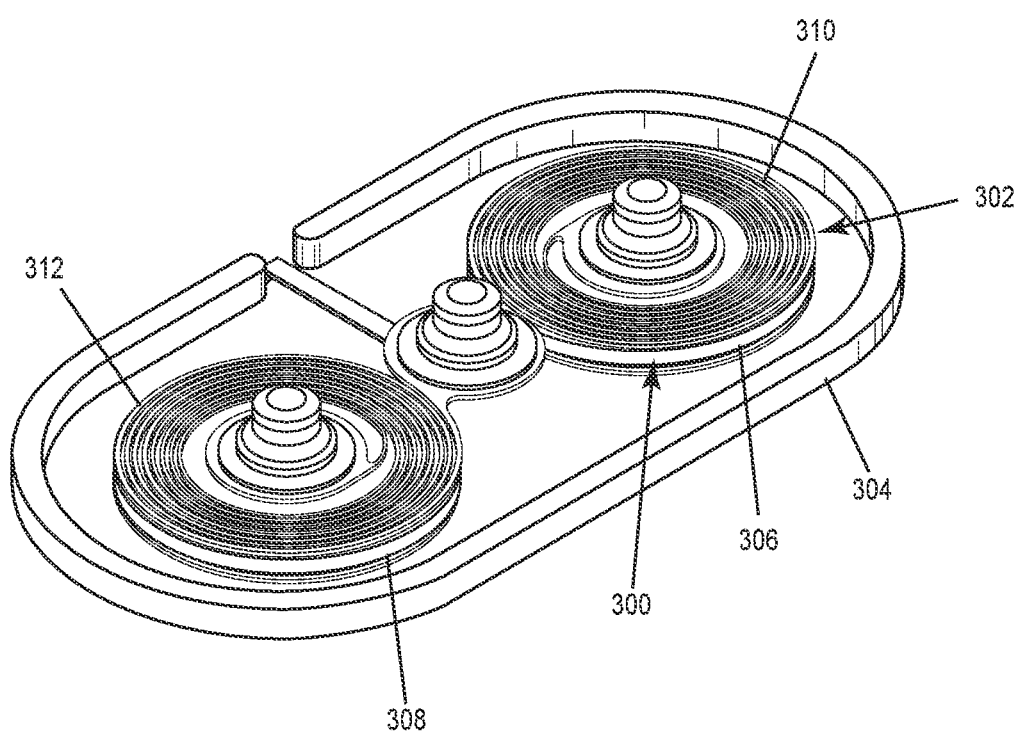
FIG. 6 illustrates a dual-coil transformer embodiment for the transformers in FIGS. 1 through 3 that have a dual-coil configuration.

FIG. 6 illustrates a dual-coil transformer embodiment for the transformers 102, 104, 106 in FIGS. 1 through 3 that have a dual-coil configuration. According to this embodiment, the transformer structure is coreless in that no magnetic core is provided. The transformer structure includes a first winding 300 formed in a first metallization layer and a second winding 302 formed in a second metallization layer, the first winding 300 and the second winding 302 being inductively coupled to one another. The first winding 300 may correspond to any of the dual-coil primary windings WP1, WP2, WP3 described herein, and the second winding 302 may correspond to any of the dual-coil secondary windings WS1, WS2, WS3 described herein. A guard ring 304 laterally surrounds the transformer structure.

In FIG. 6, the first winding 300 includes a pair of first coils 306, 308 and the second winding 302 similarly includes a pair of second coils 310, 312. Accordingly, the dual-coil transformer structure shown in FIG. 6 may be used as any of the dual-coil transformers 102, 104, 106 shown in FIGS. 1 through 3.

Figure 7:
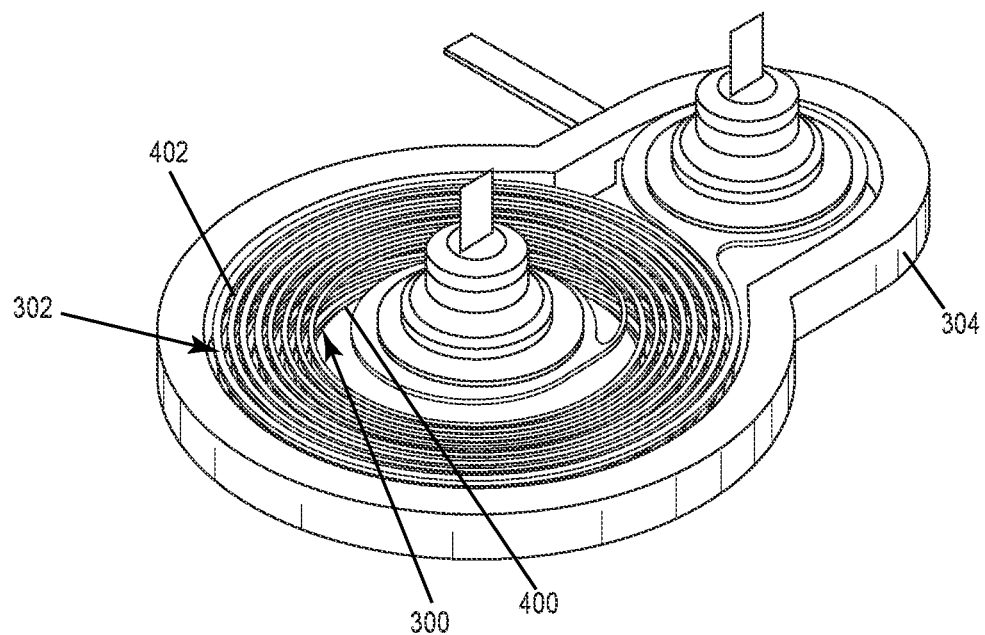
FIG. 7 illustrates a single-coil transformer embodiment for the transformers in FIGS. 1 through 3 that have a single-coil configuration.

FIG. 7 illustrates a single-coil transformer embodiment for the transformers 102, 104, 106 in FIGS. 1 through 3 that have a single-coil configuration. Like the embodiment shown in FIG. 6, the transformer structure in FIG. 7 is coreless. Different than the embodiment shown in FIG. 6, the first winding 300 includes a single coil 400 and the second winding 302 similarly includes a single second coil 402. Accordingly, the single-coil transformer structure shown in FIG. 7 may be used as any of the single-coil transformers 102, 104, 106 shown in FIGS. 1 through 3.

The transformer structures are coreless in FIGS. 6 and 7. However, the three transformers 102, 104, 106 included in the power stage 100 instead may include a magnetic core material. For example, a magnetic core material may be deposited under the transformer windings 300, 302 and/or above the transformer windings 300, 302.

Figure 8:
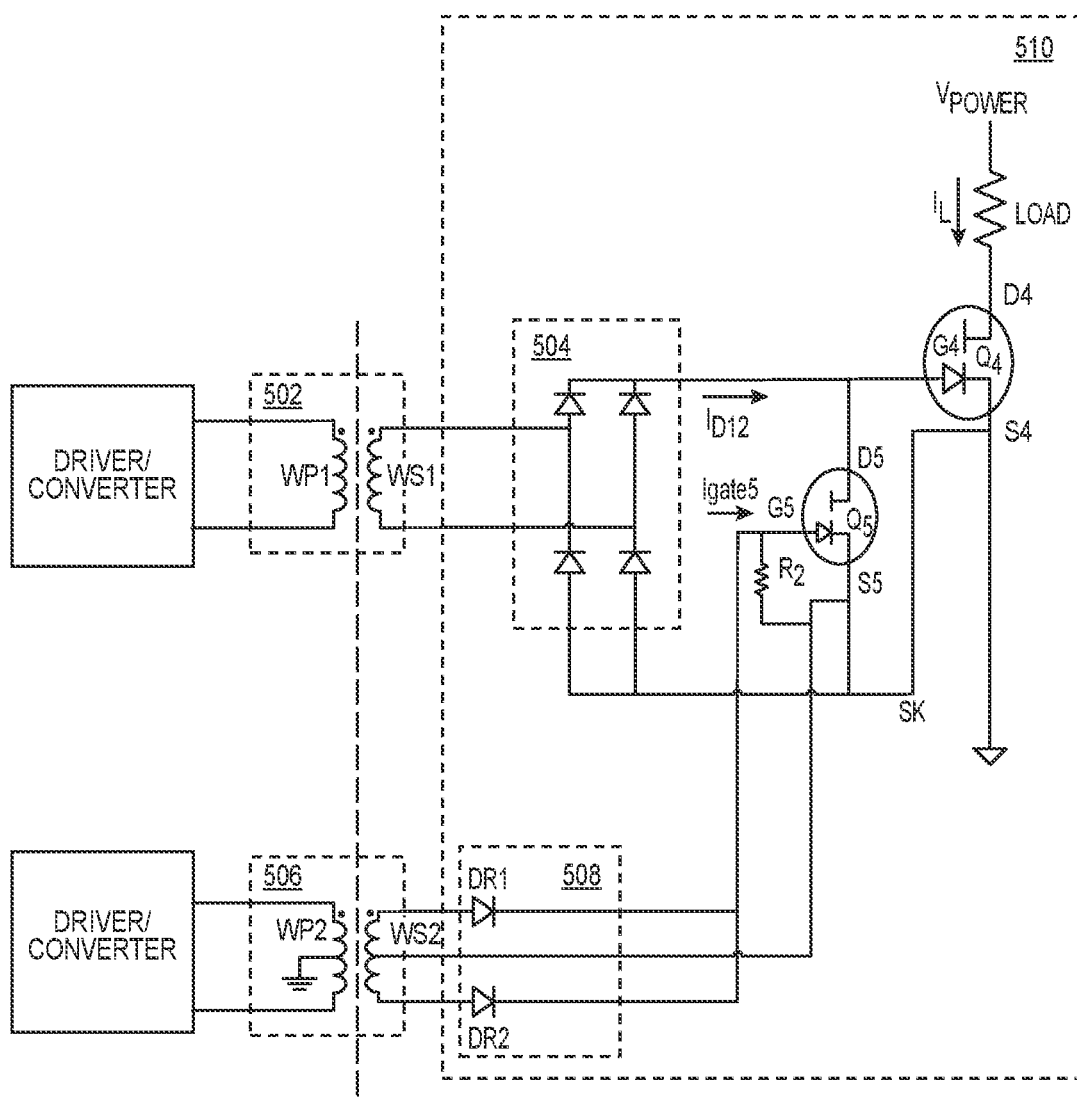
FIG. 8 illustrates a circuit schematic of another embodiment of a power stage that implements a transformer-based drive approach for a GaN power device.

FIG. 8 illustrates a circuit schematic of an embodiment of another power stage 500. The power stage 500 may form part of a power electronics circuit for use in various power applications such as such as server, datacom, telecom, adapter/charger, wireless charging, audio, lighting (e.g., LED drivers), etc., for delivering power ($V_{Power} \times I_L$) to a load 'LOAD'.

The power stage 500 includes a first transformer 502, a main GaN enhancement mode power transistor Q4, and a first rectification circuit 504. The input of the first rectification circuit 504 is coupled across a secondary coil WS1 of the first transformer 502. The output of the first rectification circuit 504 delivers current $I_{D12}$ to the gate G4 of the main GaN enhancement mode power transistor Q4.

The power stage 500 also includes a second transformer 506 having a primary coil WP2 with a grounded center tap. A GaN enhancement mode transistor Q5 is electrically connected between the gate G4 and the source S4 of the main GaN enhancement mode power transistor Q4. The GaN enhancement mode transistor Q5 is a turn OFF device for the main GaN enhancement mode power transistor Q4. A resistor R2 is electrically connected between the gate G5 and the source S5 of the turn OFF GaN enhancement mode transistor Q5. A second rectification circuit 508 has an input coupled across the secondary coil WS2 of the second transformer 506. The output of the second rectification circuit 508 delivers current 'Igate5' to the gate G5 of the turn OFF GaN enhancement mode transistor Q5. A center tap of the secondary coil WS2 of the second transformer 506 is coupled to the source S5 of the turn OFF GaN enhancement mode transistor Q5.

The two transformers 502, 506 of the power stage 500 may be coreless or have a magnetic core, as previously described herein. In one embodiment, the main GaN enhancement mode power transistor Q4, the turn OFF GaN enhancement mode transistor Q5, and the respective rectification circuits 504, 508 are integrated in the same GaN die 510.

The center-tapped secondary side coil configuration shown in FIG. 8 for the second transformer 506 addresses CMTI. When high frequency noise is injected into the source S5 of the turn OFF GaN enhancement mode transistor Q5, this noise is blocked by a filter formed from the inductance of the secondary winding WS2 of the second transformer 506 to the corresponding diode DR1/DR2 and the parasitic capacitance to the center tap of the primary winding WS2 that is grounded. This is contrary to a conventional approach having a full rectification bridge, where the noise would be rectified through the 2 diodes DR1, DR2 and turn ON the turn OFF GaN enhancement mode transistor Q5. However, power is dissipated by the turn OFF GaN enhancement mode transistor Q5 during the OFF phase of the main GaN enhancement mode power transistor Q4. Also, a center tapped second transformer 506 s used which is larger in area than a single coil transformer.

The embodiments shown in FIGS. 1 through 3 use a triple transformer configuration, where power dissipation during the ON phase in minimized to Vgs*Igate+Vca_Zener*Ica_Zener. The current Ica_Zener is the minimum bias current to keep the Zener voltage sufficiently high to maintain the normally ON device Q2 OFF. These embodiments have the further advantage of requiring zero power during the OFF state of the main power device Q1. Also, a resistor does not need to be biased with a large voltage the entire time the main power device Q1 is ON. Instead, the power needed to keep the normally ON device Q2 OFF is minimal. Even the transformer coil size may be reduced compared to conventional approaches, as the power requirements are minimized.

Although the present disclosure is not so limited, the following numbered examples demonstrate one or more aspects of the disclosure.

Example 1. A power stage, comprising: a first transformer; a second transformer; a third transformer; a GaN (gallium nitride) enhancement mode power transistor configured to conduct a load current when driven by a gate current derived from energy transferred by the first transformer; a GaN depletion mode transistor configured to turn off the GaN enhancement mode power transistor absent a threshold voltage applied across a gate and a source of the GaN depletion mode transistor; a voltage clamping device or circuit configured to turn off the GaN depletion mode transistor when reverse biased by a bias current derived from energy transferred by the second transformer; and a GaN enhancement mode transistor configured to turn on the GaN depletion mode transistor when driven by a gate current derived from energy transferred by the third transformer.

Example 2. The power stage of example 1, wherein a primary winding of the second transformer has a center tap that is grounded or disconnected, and wherein a secondary winding of the second transformer has a center tap that is coupled to the source of the GaN depletion mode transistor and to a source of the GaN enhancement mode transistor.

Example 3. The power stage of example 1, wherein a primary winding of the third transformer has a center tap that is grounded or disconnected, and wherein a secondary winding of the third transformer has a center tap that is coupled to the gate of the GaN depletion mode transistor and to a drain of the GaN enhancement mode transistor.

Example 4. The power stage of example 1, wherein a primary winding of the second transformer has a center tap that is grounded or disconnected, wherein a secondary winding of the second transformer has a center tap that is coupled to the source of the GaN depletion mode transistor and to a source of the GaN enhancement mode transistor, wherein a primary winding of the third transformer has a center tap that is grounded or disconnected, and wherein a secondary winding of the third transformer has a center tap that is coupled to the gate of the GaN depletion mode transistor and to a drain of the GaN enhancement mode transistor.

Example 5. The power stage of any of examples 1 through 4, wherein the voltage clamping device or circuit comprises a Zener diode having an anode electrically connected to the gate of the GaN depletion mode transistor and a cathode electrically connected to the source of the GaN depletion mode transistor.

Example 6. The power stage of any of examples 1 through 4, wherein the voltage clamping device or circuit comprises a GaN-gated diode having an anode electrically connected to the gate of the GaN depletion mode transistor and a cathode electrically connected to the source of the GaN depletion mode transistor.

Example 7. The power stage of any of examples 1 through 6, wherein a primary winding of the second transformer comprises a single coil, and wherein a secondary winding of the second transformer comprises a single coil.

Example 8. The power stage of example 7, further comprising: a rectification circuit having an input coupled across the single coil of the secondary winding of the second transformer and an output configured to deliver the bias current to the voltage clamping device or circuit.

Example 9. The power stage of any of examples 1 through 8, wherein a primary winding of the third transformer comprises a single coil, and wherein a secondary winding of the third transformer comprises a single coil.

Example 10. The power stage of example 9, further comprising: a diode having an anode coupled to a first end of the single coil of the secondary winding of the third transformer and a cathode configured to deliver a gate current to a gate of the GaN enhancement mode transistor.

Example 11. The power stage of example 10, wherein a primary winding of the second transformer has a center tap that is grounded or disconnected, and wherein a secondary winding of the second transformer has a center tap that is coupled to the source of the GaN depletion mode transistor and to a source of the GaN enhancement mode transistor.

Example 12. The power stage of example 11, further comprising: a first additional diode having a cathode coupled to a first end of the secondary winding of the second transformer and an anode coupled to a second end of the single coil of the secondary winding of the third transformer; and a second additional diode having a cathode coupled to a second end of the secondary winding of the second transformer and an anode electrically connected to the gate of the GaN depletion mode transistor and to an anode of the voltage clamping device or circuit, wherein a cathode of the voltage clamping device or circuit is electrically connected to the source of the GaN depletion mode transistor.

Example 13. A GaN (gallium nitride) die, comprising: a GaN enhancement mode power transistor configured to conduct a load current when driven by a gate current derived from energy transferred by a first transformer; a GaN depletion mode transistor configured to turn off the GaN enhancement mode power transistor absent a threshold voltage applied across a gate and a source of the GaN depletion mode transistor; a voltage clamping device or circuit configured to turn off the GaN depletion mode transistor when reverse biased by a bias current derived from energy transferred by a second transformer; and a GaN enhancement mode transistor configured to turn on the GaN depletion mode transistor when driven by a gate current derived from energy transferred by a third transformer.

Example 14. The GaN die of example 13, wherein the voltage clamping device or circuit comprises a Zener diode having an anode electrically connected to the gate of the GaN depletion mode transistor and a cathode electrically connected to the source of the GaN depletion mode transistor.

Example 15. The GaN die of example 13, wherein the voltage clamping device or circuit comprises a MOS-gated diode having an anode electrically connected to the gate of the GaN depletion mode transistor and a cathode electrically connected to the source of the GaN depletion mode transistor.

Example 16. The GaN die of any of examples 13 through 15, further comprising: a rectification circuit having an input configured to be coupled across a single coil of a secondary winding of the second transformer and an output configured to deliver the bias current to the voltage clamping device or circuit.

Example 17. The GaN die of any of examples 13 through 16, further comprising: a diode having an anode configured to be coupled to a first end of a single coil of a secondary winding of the third transformer and a cathode configured to deliver the bias current to the voltage clamping device or circuit.

Example 18. The GaN die of example 17, wherein the source of the GaN depletion mode transistor and a source of the GaN enhancement mode transistor are both configured to be coupled to a center tapped secondary winding of the second transformer.

Example 19. The GaN die of example 18, further comprising: a first additional diode having a cathode configured to be coupled to a first end of the secondary winding of the second transformer and an anode configured to be coupled to a second end of the single coil of the secondary winding of the third transformer; and a second additional diode having a cathode configured to be coupled to a second end of the secondary winding of the second transformer and an anode electrically connected to the gate of the GaN depletion mode transistor and to an anode of the voltage clamping device or circuit, wherein a cathode of the voltage clamping device or circuit is electrically connected to the source of the GaN depletion mode transistor.

Example 20. A power stage, comprising: a first transformer; a GaN (gallium nitride) enhancement mode power transistor; a first rectification circuit having an input coupled across a secondary coil of the first transformer and an output configured to deliver current to a gate of the GaN enhancement mode power transistor; a second transformer having a primary coil with a center tap that is grounded or disconnected; a GaN enhancement mode transistor electrically connected between the gate and a source of the GaN enhancement mode power transistor; a resistor electrically connected between a gate and a source of the GaN enhancement mode transistor; and a second rectification circuit having an input coupled across a secondary coil of the second transformer and an output configured to deliver current to the gate of the GaN enhancement mode transistor, wherein a center tap of the secondary coil is coupled to the source of the GaN enhancement mode transistor.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power stage, comprising:
   a first transformer;
   a second transformer;
   a third transformer;
   a GaN (gallium nitride) enhancement mode power transistor configured to conduct a load current when driven by a gate current derived from energy transferred by the first transformer;
   a GaN depletion mode transistor configured to turn off the GaN enhancement mode power transistor absent a threshold voltage applied across a gate and a source of the GaN depletion mode transistor;
   a voltage clamping device or circuit configured to turn off the GaN depletion mode transistor when reverse biased by a bias current derived from energy transferred by the second transformer; and
   a GaN enhancement mode transistor configured to turn on the GaN depletion mode transistor when driven by a gate current derived from energy transferred by the third transformer.

2. The power stage of claim 1, wherein a primary winding of the second transformer has a center tap that is grounded or disconnected, and wherein a secondary winding of the second transformer has a center tap that is coupled to the source of the GaN depletion mode transistor and to a source of the GaN enhancement mode transistor.

3. The power stage of claim 1, wherein a primary winding of the third transformer has a center tap that is grounded or disconnected, and wherein a secondary winding of the third transformer has a center tap that is coupled to the gate of the GaN depletion mode transistor and to a drain of the GaN enhancement mode transistor.

4. The power stage of claim 1, wherein a primary winding of the second transformer has a center tap that is grounded or disconnected, wherein a secondary winding of the second transformer has a center tap that is coupled to the source of the GaN depletion mode transistor and to a source of the GaN enhancement mode transistor, wherein a primary winding of the third transformer has a center tap that is grounded or disconnected, and wherein a secondary winding of the third transformer has a center tap that is coupled to the gate of the GaN depletion mode transistor and to a drain of the GaN enhancement mode transistor.

5. The power stage of claim 1, wherein the voltage clamping device or circuit comprises a Zener diode having an anode electrically connected to the gate of the GaN depletion mode transistor and a cathode electrically connected to the source of the GaN depletion mode transistor.

6. The power stage of claim 1, wherein the voltage clamping device or circuit comprises a GaN-gated diode having an anode electrically connected to the gate of the GaN depletion mode transistor and a cathode electrically connected to the source of the GaN depletion mode transistor.

7. The power stage of claim 1, wherein a primary winding of the second transformer comprises a single coil, and wherein a secondary winding of the second transformer comprises a single coil.

8. The power stage of claim 7, further comprising:
a rectification circuit having an input coupled across the single coil of the secondary winding of the second transformer and an output configured to deliver the bias current to the voltage clamping device or circuit.

9. The power stage of claim 1, wherein a primary winding of the third transformer comprises a single coil, and wherein a secondary winding of the third transformer comprises a single coil.

10. The power stage of claim 9, further comprising:
a diode having an anode coupled to a first end of the single coil of the secondary winding of the third transformer and a cathode configured to deliver a gate current to a gate of the GaN enhancement mode transistor.

11. The power stage of claim 10, wherein a primary winding of the second transformer has a center tap that is grounded or disconnected, and wherein a secondary winding of the second transformer has a center tap that is coupled to the source of the GaN depletion mode transistor and to a source of the GaN enhancement mode transistor.

12. The power stage of claim 11, further comprising:
a first additional diode having a cathode coupled to a first end of the secondary winding of the second transformer and an anode coupled to a second end of the single coil of the secondary winding of the third transformer; and
a second additional diode having a cathode coupled to a second end of the secondary winding of the second transformer and an anode electrically connected to the gate of the GaN depletion mode transistor and to an anode of the voltage clamping device or circuit,
wherein a cathode of the voltage clamping device or circuit is electrically connected to the source of the GaN depletion mode transistor.

13. A GaN (gallium nitride) die, comprising:
a GaN enhancement mode power transistor configured to conduct a load current when driven by a gate current derived from energy transferred by a first transformer;
a GaN depletion mode transistor configured to turn off the GaN enhancement mode power transistor absent a threshold voltage applied across a gate and a source of the GaN depletion mode transistor;
a voltage clamping device or circuit configured to turn off the GaN depletion mode transistor when reverse biased by a bias current derived from energy transferred by a second transformer; and
a GaN enhancement mode transistor configured to turn on the GaN depletion mode transistor when driven by a gate current derived from energy transferred by a third transformer.

14. The GaN die of claim 13, wherein the voltage clamping device or circuit comprises a Zener diode having an anode electrically connected to the gate of the GaN depletion mode transistor and a cathode electrically connected to the source of the GaN depletion mode transistor.

15. The GaN die of claim 13, wherein the voltage clamping device or circuit comprises a MOS-gated diode having an anode electrically connected to the gate of the GaN depletion mode transistor and a cathode electrically connected to the source of the GaN depletion mode transistor.

16. The GaN die of claim 13, further comprising:
a rectification circuit having an input configured to be coupled across a single coil of a secondary winding of the second transformer and an output configured to deliver the bias current to the voltage clamping device or circuit.

17. The GaN die of claim 13, further comprising:
a diode having an anode configured to be coupled to a first end of a single coil of a secondary winding of the third transformer and a cathode configured to deliver the bias current to the voltage clamping device or circuit.

18. The GaN die of claim 17, wherein the source of the GaN depletion mode transistor and a source of the GaN enhancement mode transistor are both configured to be coupled to a center tapped secondary winding of the second transformer.

19. The GaN die of claim 18, further comprising:
a first additional diode having a cathode configured to be coupled to a first end of the secondary winding of the second transformer and an anode configured to be coupled to a second end of the single coil of the secondary winding of the third transformer; and
a second additional diode having a cathode configured to be coupled to a second end of the secondary winding of the second transformer and an anode electrically connected to the gate of the GaN depletion mode transistor and to an anode of the voltage clamping device or circuit,
wherein a cathode of the voltage clamping device or circuit is electrically connected to the source of the GaN depletion mode transistor.

20. A power stage, comprising:
a first transformer;
a GaN (gallium nitride) enhancement mode power transistor;
a first rectification circuit having an input coupled across a secondary coil of the first transformer and an output configured to deliver current to a gate of the GaN enhancement mode power transistor;
a second transformer having a primary coil with a center tap that is grounded or disconnected;
a GaN enhancement mode transistor electrically connected between the gate and a source of the GaN enhancement mode power transistor;
a resistor electrically connected between a gate and a source of the GaN enhancement mode transistor; and
a second rectification circuit having an input coupled across a secondary coil of the second transformer and an output configured to deliver current to the gate of the GaN enhancement mode transistor,
wherein a center tap of the secondary coil is coupled to the source of the GaN enhancement mode transistor.

\* \* \* \* \*